United States Patent
Ning

(10) Patent No.: US 9,602,105 B1
(45) Date of Patent: Mar. 21, 2017

(54) PERFORMANCE-ON-DEMAND IC CHIP DESIGN IN INTEGRATED-INJECTION LOGIC

(71) Applicant: International Business Machines Corporation, Armonk, NY (US)

(72) Inventor: Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/940,567

(22) Filed: Nov. 13, 2015

(51) Int. Cl.
    *H03K 19/091* (2006.01)
    *H03K 19/018* (2006.01)

(52) U.S. Cl.
    CPC .............. *H03K 19/01818* (2013.01)

(58) Field of Classification Search
    CPC ..... H01L 27/12; H01L 27/0233; H01L 27/00; H01L 27/075; B22F 1/0085; B22F 2998/00; B24C 11/00; H03K 23/002; H03K 19/091; H03K 19/013; H03K 19/01818
    USPC .. 326/75–79, 82, 89–92, 100, 109, 124–128
    See application file for complete search history.

(56) References Cited

U.S. PATENT DOCUMENTS

| | | | | |
|---|---|---|---|---|
| 4,065,680 A | * | 12/1977 | Russell | .................. H03K 3/037 326/100 |
| 4,716,314 A | * | 12/1987 | Mulder | ................. B22F 1/0085 257/205 |
| 4,843,448 A | * | 6/1989 | Garcia | .................... H01L 27/12 257/477 |
| 8,927,380 B2 | | 1/2015 | Cai et al. | ....................... 438/311 |

OTHER PUBLICATIONS

Ning, et al., On the Performance and Scaling of Symmetric Lateral Bipolar Transistors on SOI, IEEE Journal of the Electron Devices Society, vol. 1, No. 1, Jan. 2013.
Padmanabhan Pillai et al., Real-Time Dynamic Voltage Scaling for Low-Power Embedded Operating Systems, pp. 1-14 (publication dated unknown).
Johan Pouwelse et al., Dynamic Voltage Scaling on a Low-Power Microprocessor, ACM SIGMOBILE, pp. 251-259 (2001).
Thomas Burd et al., WA 17.4 A Dynamic Voltage Scaled Microprocessor System, 2000 IEEE International Solid-State Circuits Conference, pp. 1-3 (2000).
K. Aufinger et al., "Integrated injection logic in high-speed SiGe bipolar technology," IEEE, pp. 1-5 (2011).

* cited by examiner

*Primary Examiner* — Alexander H Taningco
*Assistant Examiner* — Seokjin Kim
(74) *Attorney, Agent, or Firm* — Ido Tuchman; Louis J. Percello

(57) ABSTRACT

A circuit comprising a first injection BJT in a common-base configuration and configured to output a first injection current at its collector. A first multiple-collector BJT is in an open collector configuration, is electrically coupled to the first injection BJT, and is arranged to receive the first injection current at its base. The first multiple-collector BJT has a capacitance load at one of its collectors. A first supply voltage is electrically coupled to the first injection BJT. The first supply voltage is configured to dynamically adjust during operation of the circuit in response to a change in the capacitance load of the first multiple-collector BJT.

20 Claims, 2 Drawing Sheets

PERFORMANCE-ON-DEMAND IC CHIP DESIGN IN INTEGRATED-INJECTION LOGIC

BACKGROUND

The present invention is directed toward semiconductor circuits, and more particularly to complementary lateral bipolar junction transistor (BJT) circuits using Integrated Injection Logic ($I^2L$).

From the mid to the late 1970's, there was a lot of excitement in the VLSI industry about the prospect of $I^2L$. $I^2L$ is by far the densest circuit. It uses small sized devices, and requires one PNP per gate for current injection and only one NPN per fan-out. Thus an inverter with FO=3 takes only four transistors. The NPN transistors in an $I^2L$ circuit operate in the reverse-active mode. As a result, even with advanced self-aligned vertical Si-based BJT technology, $I^2L$ has minimum delays not much below one nanosecond. This speed limitation, together with the rapid progress in complementary metal-oxide semiconductor (CMOS) scaling in the early 1980's, caused the demise of $I^2L$.

Digital logic is currently dominated by silicon CMOS circuits. It is desirable to reduce the operating voltage for CMOS circuits due to increased power consumption and heating in scaled CMOS technologies. However, CMOS performance is reaching a limit due to its poor signal-to-noise margins at low operating voltages (i.e., less than 0.5 volts).

In a bipolar junction transistor inverter circuit, the output current is exponentially dependent on the input voltage, giving much higher transconductance and potentially faster switching speed than CMOS. However, conventional vertical BJTs are generally not suitable for high density digital logic because of their large footprint due to isolation structure, their large parasitic capacitance due to the relatively large base-collector junction area, and associated minority carrier charge storage when biased in the saturation mode, that is when the collector-base diode is forward biased.

In contrast to vertical BJTs, when a lateral NPN transistor is turned on with a voltage $V_{BE}$, its base current flows vertically down from the base terminal and then turns and flows in the intrinsic base horizontally toward the emitter. The vertical base current flow causes a vertical IR drop between the top (p+/p interface) and the bottom (p/BOX interface) of the intrinsic base, causing $V'_{BE}$(top) to be larger than $V'_{BE}$(bottom). When this voltage difference is larger than kT/q, there is appreciable current crowding, with the local current density appreciably larger near the top than near the bottom. As the current increases, at some point the local minority-carrier density becomes larger than the majority-carrier density. Beyond that point, the dependence of current on $V_{BE}$ degrades. For a vertical transistor, this "current degradation" point is determined by the collector, which is the most lightly doped region. For a symmetric lateral transistor, the degradation point is determined by the base, which is the most lightly doped region.

In complementary thin-base symmetric lateral BJTs on SOI, there is the absence of a lightly doped collector. The lateral transistors have no deleterious base push out effect. Unlike vertical BJTs, there is no rapid performance drop off at high current densities. The lateral transistors operate equally fast in forward-active and reverse-active modes. The unique characteristics of symmetric lateral BJTs, with no base push out and equal speed in forward-active and reverse-active modes, suggest a need to rethink BJT circuits and circuit opportunities offered by the technology.

The layout of lateral BJT is similar to that of CMOS. One difference could be in the placement of metal contact to the extrinsic base. In CMOS, the metal contact to the gate is located away from the inversion channel region. In a BJT, if $r_{bx}$ is a concern, metal contact to the extrinsic base should be located over the intrinsic base, not away from the intrinsic base. If needed, two silicon thicknesses may be used, one for CMOS and one for lateral BJT.

BJTs are used in driver circuits where high current is required given the exponential dependence of the output current on the input voltage. The turn-on voltage of BJTs is dependent on the bandgap of the consisting materials. For BJTs made of Si, a typical turn-on voltage of approximately 0.9V to 1V is needed.

BRIEF SUMMARY

Accordingly, aspects of the present invention include circuits designed in integrated-injection logic ($I^2L$) circuits that can achieve speed improvement at the gate level, the logic macro level or CPU core level by employing multiple power supply voltages for the logic circuits, logic macros, or CPU cores.

One example aspect of the present invention is a circuit including a first injection bipolar junction transistor (BJT) and a first multiple-collector BJT. The first injection BJT is arranged in a common-base configuration, is electrically coupled to a first supply voltage, and configured to output a first injection current at its collector. The first multiple-collector BJT is arranged in an open collector configuration. The first multiple-collector BJT is electrically coupled to the first injection BJT and is arranged to receive the first injection current at its base. The first multiple-collector BJT has a capacitance load at one of its collectors. A first power supply outputs the first supply voltage, and is configured to dynamically adjust the first supply voltage during operation of the circuit in response to a change in the capacitance load of the first multiple-collector BJT.

Another example aspect of the present invention is a logic block including a set of inverters. Each inverter from the set of inverters is configured to float its output when its input is shunted to ground and sink its output to ground when its input is not shunted to ground. Each inverter includes an injection BJT in a common-base configuration electrically coupled to a supply voltage and is configured to output an injection current at its collector. Each inverter further includes a multiple-collector BJT in an open collector configuration. The multiple-collector BJT is electrically coupled to the injection BJT and arranged to receive the injection current at its base. A boundary inverter from the set of inverters is electrically coupled at its base to a non-boundary inverter from the set of inverters. The boundary inverter is configured to drive, at its multiple-collector BJT, an output signal outside the logic block. A first supply voltage is electrically coupled to the supply voltage of the boundary inverter. A second supply voltage is electrically coupled to the supply voltage of the non-boundary inverter. The first supply voltage and the second supply voltage are electrically isolated from each other.

A further example aspect of the present invention is a first injection BJT and a first multiple-collector BJT. The first injection BJT is arranged in a common-base configuration, is electrically coupled to a first supply voltage, and is configured to output a first injection current at its collector. The first multiple-collector BJT is arranged in an open collector configuration, is electrically coupled to the first injection BJT, and is configured to receive the first injection current at its base. The first multiple-collector BJT has a capacitance load at one of its collectors. A second injection BJT is arranged in the common-base configuration and is electrically coupled to a second supply voltage. A second multiple-collector BJT is arranged in the open collector configuration. The second multiple-collector BJT is electrically coupled at its collector to the base of the first multiple-collector BJT. A first power supply is configured to output the first supply voltage and a second power supply is configured to output the second supply voltage. The second supply voltage is different from the first supply voltage. The first supply voltage and the second supply voltage are electrically isolated from each other.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1 and 2.

An aspect of the present invention is a circuit with multiple power supply voltages for integrated-injection logic ($I^2L$). Performance-power tradeoffs of greater than ten times are readily achievable with the circuit.

Figure 1:
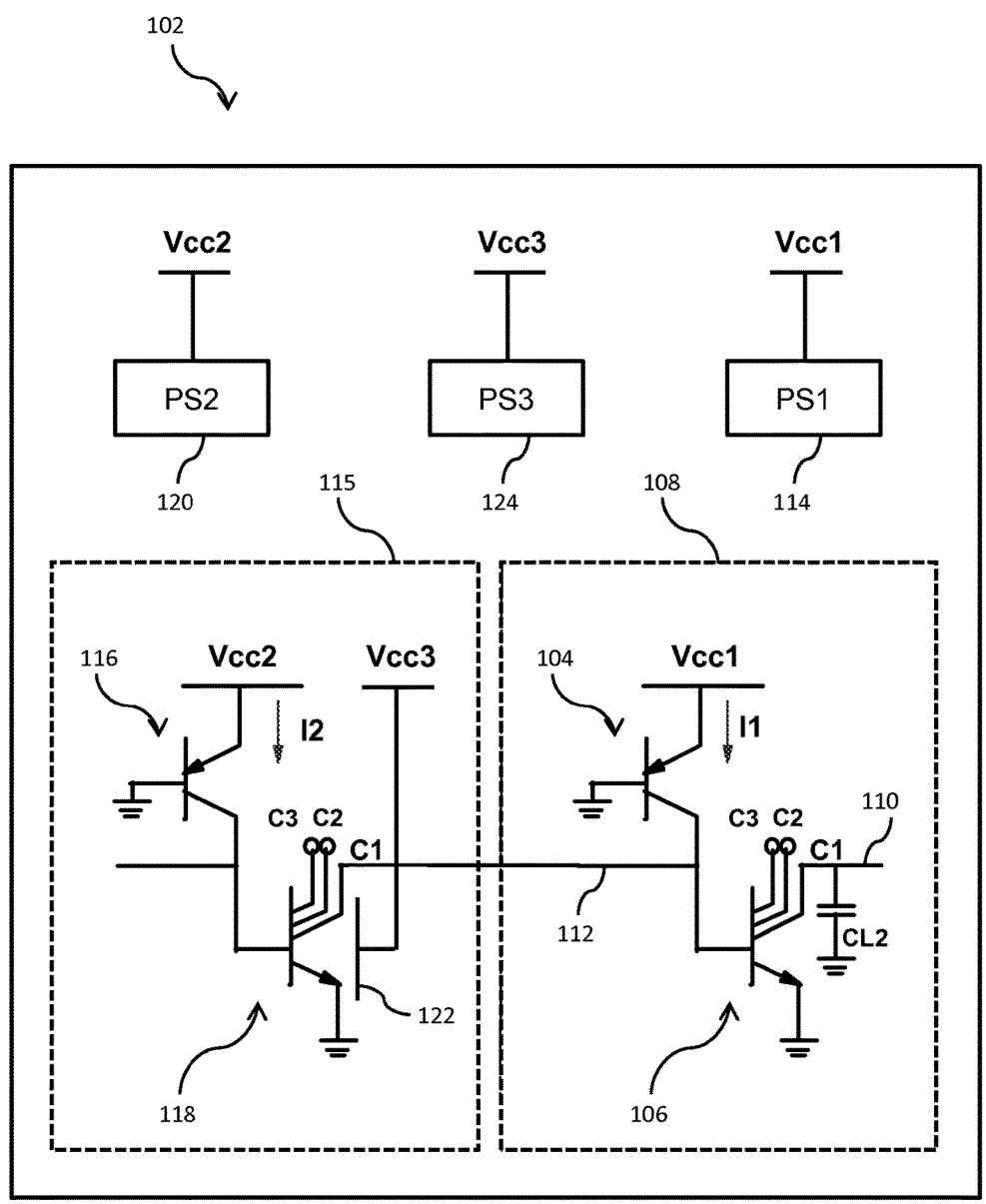
FIG. 1 shows an example circuit according to one embodiment of the present invention.

FIG. 1 shows an example circuit 102 according to one embodiment of the present invention. The circuit 102 includes a first injection BJT 104 in a common-base configuration. That is, the transistor's emitter is connected to Vcc, the transistor's collector is connected to output, and the base, which controls the electrical path between the collector and emitter, is connected to ground. In one embodiment, the first injection BJT 104 is a PNP lateral BJT transistor. In this embodiment, the base of the first injection BJT 104 is connected to ground. The first injection BJT is electrically coupled to a first supply voltage (Vcc1) and is configured to output a first injection current at its collector. In operation, the voltage Vcc1 causes the emitter-base diode of the PNP BJT to be forward biased, injecting a hole current from the emitter of the PNP into the base of the PNP. As the injected holes arrive at the collector of the PNP, they contribute to a collector current in the PNP BJT. Thus, the first injection BJT 104 acts as a constant current source.

The circuit 102 also includes a first multiple-collector BJT 106 in an open collector configuration. That is, the transistor's collector is connected to the output, the transistor's emitter is connected to ground, and the base controls the electrical path between the collector and emitter. In one embodiment, first multiple-collector BJT 106 is an NPN lateral BJT. As used herein, a "lateral BJT" conducts electricity horizontally with respect to the substrate between an emitter and a collector when the lateral BJT is active. In contrast to vertical BJTs, when a lateral BJT is turned on with a voltage $V_{BE}$, its base current flows vertically down from the base terminal, turns and flows in the intrinsic base horizontally toward the emitter.

The first multiple-collector BJT 106 is electrically coupled to the first injection BJT 104 and is arranged to receive the first injection current I1 at its base. Thus, the first injection BJT 104 and the first multiple-collector BJT 106 form a first inverter 108. The first inverter 108 is configured to float its output 110 when its input 112 is shunted to ground and sink its output 110 to ground when its input 112 is not shunted to ground.

The circuit 102 includes a first power supply 114, such as a linear regulator or a switching regulator, arranged to output the first supply voltage Vcc1. The first power supply 114 is configured to dynamically adjust the first supply voltage Vcc1 during operation of the circuit 102 in response to a change in the capacitance load CL2 and/or drive current of the first multiple-collector BJT 104.

The circuit 102 includes a second inverter 115 with a second injection BJT 116 in the common-emitter configuration. The second injection BJT 116 is electrically coupled to a second supply voltage Vcc2. A second multiple-collector BJT 118 is arranged in the open collector configuration. The second multiple-collector BJT 118 is electrically coupled at its collector to the base of the first multiple-collector BJT 106. In one embodiment, the second injection BJT 116 is a PNP lateral BJT, and the second multiple-collector BJT 118 is an NPN lateral BJT.

The circuit 102 includes a second power supply 120 arranged to output the second supply voltage Vcc2. In one embodiment, the second supply voltage Vcc2 is different from the first supply voltage Vcc1, and the first supply voltage Vcc1 and the second supply voltage Vcc2 are electrically isolated from each other.

In order for the second multiple-collector BJT 118 to drive the first inverter 108, the second multiple-collector BJT 118 should be able to sink the first injection current I1 from first injection BJT 104. Consider, for example, an $I^2L$ gate with fan-out of 3 (second inverter 115) driving another $I^2L$ gate with fan-out of 3 (first inverter 108). Since the second inverter 115 has FO=3, the collector current at C1 is [I2×Beta(npn)/3], where Beta(npn) is current gain of the npn device in the $I^2L$ gate. For proper operation, the collector current at C1 has to be larger than I1 in order to pull the "input" node of the first inverter 108 to ground. That is, for proper operation, we need [I2×Beta(npn)/3]>I1, or Beta(npn)>3(I1/I2). For I1=10×I2, we need Beta(npn)>30. High current gain for the npn can be readily achieved by using narrow-gap-base, e.g., SiGe base and Si emitter, device structure, or using positive substrate bias to the $I^2L$ chip.

Thus, in one embodiment, the circuit 102 includes a backplate 122 positioned below the second multiple-collector BJT 118. The process for fabricating a backplate below BJT is disclosed in U.S. Pat. No. 8,927,380 issued Jan. 6, 2015. U.S. Pat. No. 8,927,380 is incorporated herein by reference in its entirety.

The backplate 122 is electrically biased by a third supply voltage Vcc3 such that a collector current of the second multiple-collector BJT 118 changes as a function of the third supply voltage Vcc3. A third power supply 124 is arranged to output the third supply voltage Vcc3. The second supply voltage Vcc2 and the third supply voltage Vcc3 are electrically isolated from each other. In a particular embodiment, the third power supply 124 is configured to dynamically adjust the third supply voltage Vcc3 during operation of the circuit 102 in response to a change in the first injection current I1. The second multiple-collector BJT 118 may be, either alternatively or in addition to the backplate configuration, a lateral heterojunction NPN BJT.

Figure 2:
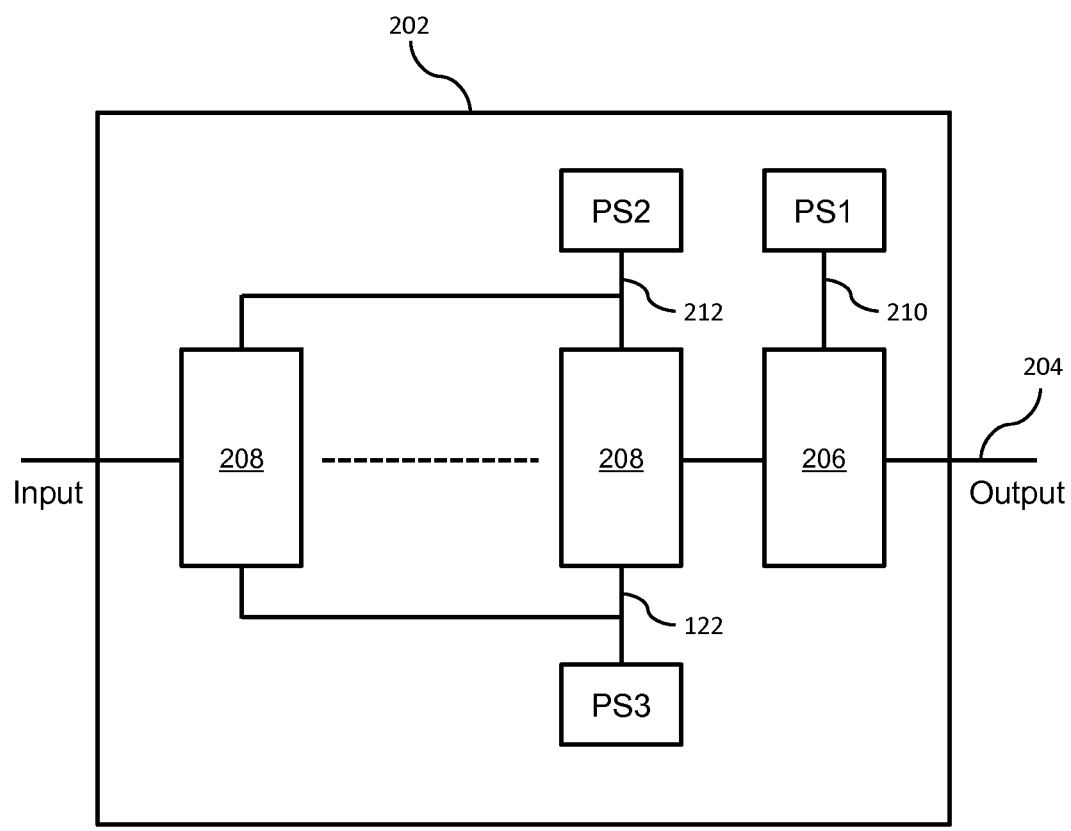
FIG. 2 shows an example logic block 202 according to one embodiment of the present invention.

FIG. 2 shows an example logic block 202 according to one embodiment of the present invention. The logic block may be, of instance, a logic macro or a CPU core. The logic block includes an output signal 204 outside the logic block 202 that needs to drive a long distance on the same chip, or to drive off chip to reach another chip. That is, the output signal 204 has to drive much larger capacitance than a typical gate within the logic block 202.

The logic block 202 includes a set of inverters 206, 208. Each inverter from the set of inverters is is configured to float its output when its input is shunted to ground and sink its output to ground when its input is not shunted to ground. As detailed above, each inverter includes an injection BJT in a common-base configuration electrically coupled to a supply voltage and configured to output an injection current at its collector, and a multiple-collector BJT in an open collector configuration. The multiple-collector BJT is electrically coupled to the injection BJT and arranged to receive the injection current at its base. In one embodiment, the injection BJT of each inverter from the set of inverters is a PNP lateral BJT, and the multiple-collector BJT of each inverter from the set of inverters is an NPN lateral BJT. The multiple-collector BJT may be a heterojunction NPN BJT.

The logic block 202 includes a boundary inverter 206 from the set of inverters. The boundary inverter 206 electrically coupled to a non-boundary inverter 208 at its base. Furthermore, the boundary inverter 206 is configured to drive, at its multiple-collector BJT, the output signal 204 outside the logic block 202.

The logic block 202 includes a first supply voltage 210 electrically coupled to the supply voltage of the boundary inverter 206. In one embodiment, the first supply voltage 210, supplied by a first power supply PS1, is configured to dynamically adjust during operation of the logic block 202 in response to a change in a capacitance load of the output signal 204.

A second supply voltage 212 is electrically coupled to the supply voltage of the non-boundary inverter 208. The first supply voltage 210 and the second supply voltage 212 are electrically isolated from each other. The logic block 202 may include a second power supply PS2 configured to supply the second supply voltage 212 to the non-boundary inverter 208.

The logic block 202 may include a third power supply PS3 arranged to output a third supply voltage 214. The second supply voltage 214 and the third supply voltage 212 are electrically isolated from each other. The third supply voltage 214 is configured to bias a backplate 122 positioned below the multiple-collector BJT of the non-boundary inverter 208 such that a collector current of the multiple-collector BJT of the non-boundary inverter 208 changes as a function of the third supply voltage 214. In one embodiment, the third power supply PS3 is configured to dynamically adjust the third supply voltage 214 during operation of the logic block 202 in response to a change in the injection current of the boundary inverter 204.

Thus, embodiments of the present invention can drive capacitances that are large and small on demand with the same circuit design by adjusting a power supply voltage. For a given logic gate or logic macro, the speed can be dialed up or down over a wide range just by changing the power supply voltage Vcc.

Depending on the design needs, a circuit can have several power supplies. For example, one power supply with a high supply voltage can be coupled to a driver inverter supplying a high-capacitance output signal off chip. Other power supplies may drive different internal inverters with different voltages. Furthermore, the supply voltages may be adjusted as speed requirements change during operation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
   a first injection bipolar junction transistor (BJT) in a common-base configuration and configured to output a first injection current at its collector;
   a first multiple-collector BJT in an open collector configuration, the first multiple-collector BJT electrically coupled to the first injection BJT and arranged to receive the first injection current at its base, the first multiple-collector BJT having a capacitance load at one of its collectors; and
   a first supply voltage electrically coupled to the first injection BJT, the first supply voltage configured to dynamically adjust during operation of the circuit in response to a change in the capacitance load of the first multiple-collector BJT.

2. The circuit of claim 1, further comprising:
   wherein the first injection BJT is a PNP lateral BJT; and
   wherein the first multiple-collector BJT is an NPN lateral BJT.

3. The circuit of claim 1, further comprising:
   a first power supply arranged to output the first supply voltage, the first power supply configured to dynamically adjust the first supply voltage during operation of the circuit in response to the change in the capacitance load of the first multiple-collector BJT;
   a second injection BJT in the common-base configuration electrically coupled to a second supply voltage;
   a second multiple-collector BJT in the open collector configuration, the second multiple-collector BJT electrically coupled at its collector to the base of the first multiple-collector BJT; and
   a second power supply arranged to output the second supply voltage, the first supply voltage and the second supply voltage are electrically isolated from each other.

4. The circuit of claim 3, further comprising:
   a third power supply arranged to output a third supply voltage, the second supply voltage and the third supply voltage are electrically isolated from each other; and
   a backplate positioned below the second multiple-collector BJT, the backplate electrically biased by the third supply voltage such that a collector current of the second multiple-collector BJT changes as a function of the third supply voltage.

5. The circuit of claim 4, wherein the third power supply is configured to dynamically adjust the third supply voltage during operation of the circuit in response to a change in the first injection current.

6. The circuit of claim 3, wherein the second multiple-collector BJT is a lateral heterojunction NPN BJT.

7. The circuit of claim 3, further comprising:
   wherein the second injection BJT is a PNP lateral BJT; and wherein the second multiple-collector BJT is an NPN lateral BJT.

8. A logic block comprising:
a set of inverters, each inverter from the set of inverters configured to float its output when its input is shunted to ground and sink its output to ground when its input is not shunted to ground, each inverter from the set of inverters including:
an injection bipolar junction transistor (BJT) in a common-base configuration electrically coupled to a supply voltage and configured to output an injection current at its collector;
a multiple-collector BJT in an open collector configuration, the multiple-collector BJT electrically coupled to the injection BJT and arranged to receive the injection current at its base;
a boundary inverter from the set of inverters, the boundary inverter electrically coupled at its base to a non-boundary inverter from the set of inverters, the boundary inverter configured to drive, at its multiple-collector BJT, an output signal outside the logic block;
a first supply voltage electrically coupled to the supply voltage of the boundary inverter;
a second supply voltage electrically coupled to the supply voltage of the non-boundary inverter, the first supply voltage and the second supply voltage are electrically isolated from each other.

9. The logic block of claim 8, wherein the first supply voltage is configured to dynamically adjust during operation of the logic block in response to a change in a capacitance load of the output signal.

10. The logic block of claim 9, further comprising:
a first power supply configured to supply the first supply voltage to the boundary inverter
a second power supply configured to supply the second supply voltage to the non-boundary inverter.

11. The logic block of claim 8, further comprising:
a third power supply arranged to output a third supply voltage, the second supply voltage and the third supply voltage are electrically isolated from each other; and
a backplate positioned below the multiple-collector BJT of the non-boundary inverter, the backplate electrically biased by the third supply voltage such that a collector current of the multiple-collector BJT of the non-boundary inverter changes as a function of the third supply voltage.

12. The logic block of claim 11, wherein the third power supply is configured to dynamically adjust the third supply voltage during operation of the logic block in response to a change in the injection current of the boundary inverter.

13. The logic block of claim 8, further comprising:
wherein the injection BJT of each inverter from the set of inverters is a PNP lateral BJT; and
wherein the multiple-collector BJT of each inverter from the set of inverters is an NPN lateral BJT.

14. The logic block of claim 8, wherein the multiple-collector BJT of the non-boundary inverter is a lateral heterojunction NPN BJT.

15. A circuit comprising:
a first injection bipolar junction transistor (BJT) in a common-base configuration electrically coupled to a first supply voltage and configured to output a first injection current at its collector;
a first multiple-collector BJT in an open collector configuration, the first multiple-collector BJT electrically coupled to the first injection BJT and arranged to receive the first injection current at its base, the first multiple-collector BJT having a capacitance load at one of its collectors;
a second injection BJT in the common-base configuration electrically coupled to a second supply voltage;
a second multiple-collector BJT in the open collector configuration, the second multiple-collector BJT electrically coupled at its collector to the base of the first multiple-collector BJT; and
a first power supply arranged to output the first supply voltage; and
a second power supply arranged to output the second supply voltage different from the first supply voltage, the first supply voltage and the second supply voltage are electrically isolated from each other.

16. The circuit of claim 15, wherein the first power supply configured to dynamically adjust the first supply voltage during operation of the circuit in response to a change in the capacitance load of the first multiple-collector BJT.

17. The circuit of claim 15, further comprising:
a third power supply arranged to output a third supply voltage, the second supply voltage and the third supply voltage are electrically isolated from each other; and
a backplate positioned below the second multiple-collector BJT, the backplate electrically biased by the third supply voltage such that a collector current of the second multiple-collector BJT changes as a function of the third supply voltage.

18. The circuit of claim 17, wherein the third power supply is configured to dynamically adjust the third supply voltage during operation of the circuit in response to a change in the first injection current.

19. The circuit of claim 15, further comprising:
wherein the first injection BJT and the second injection BJT are PNP lateral BJTs; and
wherein the first multiple-collector BJT and the second multiple-collector BJT are NPN lateral BJTs.

20. The circuit of claim 15, wherein the second multiple-collector BJT is a lateral heterojunction NPN BJT.

* * * * *